(12) United States Patent
Alexander et al.

(10) Patent No.: US 6,208,500 B1
(45) Date of Patent: Mar. 27, 2001

(54) HIGH QUALITY FACTOR CAPACITOR

(75) Inventors: Sam E. Alexander; Randy L. Yach, both of Phoenix; Roger St. Amand, Tempe, all of AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 09/200,542

(22) Filed: Nov. 25, 1998

(51) Int. Cl.[7] .................................................. H01G 4/005
(52) U.S. Cl. ......................... 361/303; 361/306.3; 257/532
(58) Field of Search ..................................... 361/303, 305, 361/306.2, 306.3, 311–313, 321.1–321.5, 322; 257/532, 535

(56) References Cited

U.S. PATENT DOCUMENTS 5,479,316 * 12/1995 Smrtic et al. ......................... 361/322
5,583,359 * 12/1996 Ng et al. .............................. 257/306
5,608,246 * 3/1997 Yeager et al. ....................... 257/295
5,917,230 * 6/1999 Aldrich ................................ 257/532

* cited by examiner

Primary Examiner—Anthony Dinkins
(74) Attorney, Agent, or Firm—Baker Botts L.L.P.

(57) ABSTRACT

An improved high quality factor capacitive device is implemented on a single, monolithic integrated circuit. The new layout techniques improve the quality factor (Q) of the capacitor by reducing intrinsic resistance of the capacitor by reducing the distance between the metal contacts of the top and bottom conductive plates. The layout techniques require laying out the top conductive plate of the capacitor in strips such that metal contacts from the bottom conductive plate pass in between the strips and through the dielectric layer. Alternatively, the apertures may be etched into the top conductive plate so that metal contacts pass through the apertures and connect to the bottom conductive plate.

5 Claims, 3 Drawing Sheets

HIGH QUALITY FACTOR CAPACITOR

BACKGROUND OF THE INVENTION

1. Field of the Invention

This invention relates generally to the fabrication of semiconductor devices. Specifically this invention identifies new layout techniques for fabricating high quality capacitors on semiconductor devices.

2. Description of the Prior Art

The quality factor (i.e. electrical engineering symbol "Q") of a resonant circuit or component is defined as the ratio of the energy stored in a reactive component, such as a capacitor, to the energy dissipated in a resistive component. For simple resistor-inductor-capacitor circuits, the inductor and capacitor store energy while the resistor dissipates some of the energy. Intuitively, if the resistance is large, any initial oscillation will quickly decay to zero. A small resistance will keep the circuit oscillating longer. In the case of the capacitor, Q is defined as:

$$Q = \frac{\text{Energy Stored }(C)}{\text{Energy Dissipated }(R)} = \frac{Pwr(C)*t}{Pwr(R)*t} \tag{1}$$

As can be seen in equation (1), Q is inversely proportional to the resistance. The main component relating to the quality factor of a capacitor is the series resistance inherent within the device. To achieve a high Q, the resistance in the capacitor, as shown in equation (1), should be minimized.

The current state of the art, as shown in FIG. 1, describes a capacitor layout where the top and bottom conductive plates of approximately the same area, are laterally offset to allow for penetration of the contacts on the bottom plate through the layers of the semiconductor. In the prior art, the series resistance is primarily attributable to the significant distance between the top and bottom plate contacts.

Therefore, a need existed to provide a new layout that reduces the distance between contacts which then reduces the intrinsic resistive component of a capacitor as shown in equation (1). Upon achieving a reduction in the series resistance, the quality factor of the capacitor may be optimized.

SUMMARY OF THE INVENTION

It is an object of the present invention to provide a new layout technique for a capacitor on a semiconductor device.

It is another object of the present invention to provide a new layout technique which improves the quality factor of the capacitor.

It is another object of the present invention to provide a new layout technique which reduces the series resistance intrinsic to a capacitor.

It is another object of the present invention to provide a new layout technique which provides cost efficient fabrication.

In accordance with one embodiment of the present invention, an improved layout technique for a capacitor is comprised of at least one bottom conductive plate, a dielectric layer coupled to the at least one bottom plate, a plurality of top conductive plates coupled to the dielectric layer, a plurality of metal contacts coupled to the at least one bottom conductive plate wherein at least one of the plurality of contacts is located between a gap created by two of the plurality of the top conductive plates and a second plurality of metal contacts coupled to the plurality of top conductive plates.

In accordance with another embodiment of the present invention, the bottom conductive plate may be a single plate.

In accordance with another embodiment of the present invention, the bottom conductive plate may be a plurality of conductive plates.

In accordance with another embodiment of the present invention an improved layout technique for a high Q capacitor comprises a bottom conductive plate, a dielectric layer coupled to the at least one bottom plate, a top conductive plate couple to the dielectric layer wherein the top conductive plate comprises a plurality of apertures, a plurality of metal contacts coupled to the bottom conductive plate wherein at least one of the plurality of metal contacts penetrates at least one of the plurality of apertures without contacting the top conductive plate, and a second plurality of metal contacts coupled to the top conductive plate.

The foregoing and other objects, features, and advantages of the invention will be apparent from the following, more particular, description of the preferred embodiments of the invention, as illustrated in the accompanying drawings.

DETAILED DESCRIPTION OF THE PREFERRED EMBODIMENT

Figure 1:
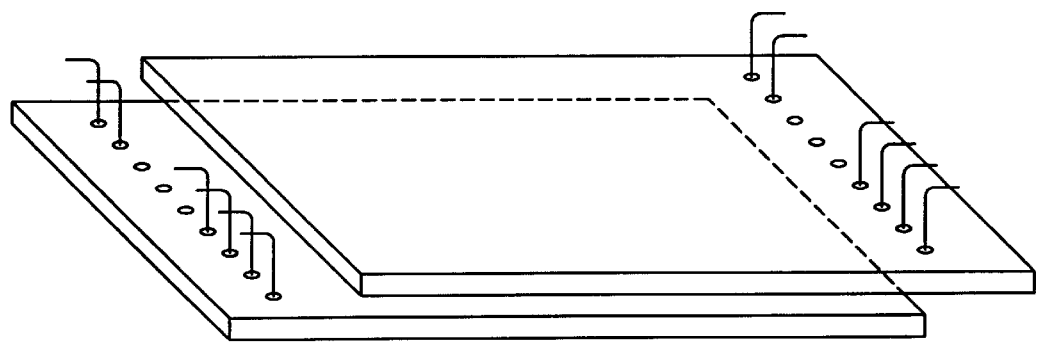
FIG. 1 is an illustration of the prior art.
Figure 2:
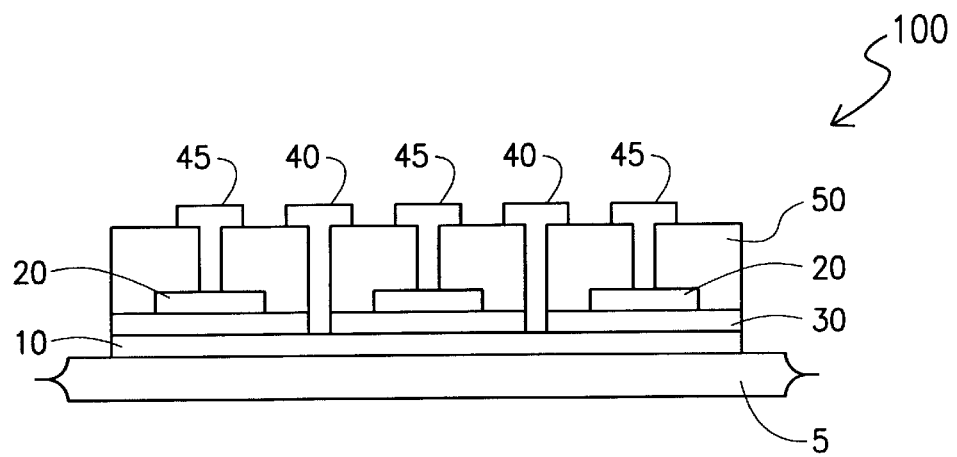
FIG. 2 is a cross section of one embodiment of the present invention.

Referring to FIG. 2, a improved layout technique for a high quality factor capacitor 100 is shown. The improved layout technique comprises a capacitor with a common bottom plate 10 deposited on a field oxide 5, a plurality of top plates 20 and common dielectric layer 30 between the bottom plate 10 and the top plates 20. The top plates 20 of conductive material are laid out in rows or strips by known pholithographic and etching techniques.

A non-conductive layer 50, shown in the figures as a single layer, but which may be the amalgamation of several non-conductive layers, fills the avenues between the conductive strips of the top plates 20 and covers the top plates 20 in order to isolate the bottom plate 10 and the top plates 20 from each other and from subsequent conductive layers. Each top plate 20 has one or more metal contacts 45 and the bottom plate 10 has a plurality of contacts 40 which penetrate the dielectric 30 and non-conductive layers 50 via the avenues created by the top plate strips 20. The metal contacts 40 and 45 may be connected to the remainder of the circuit.

Figure 3:
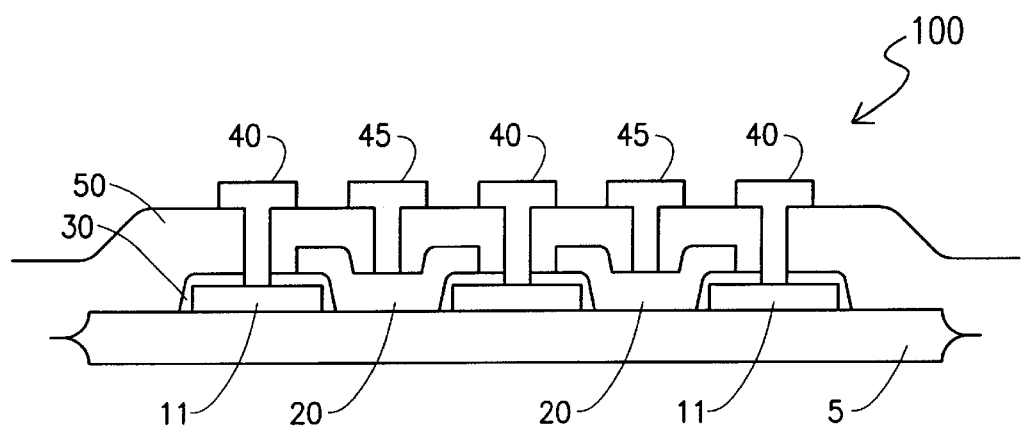
FIG. 3 is a cross section of a second embodiment of the present invention.

Referring to FIG. 3, where like numerals correspond to like elements, a second embodiment of the improved layout technique for a high Q capacitor 100 comprises a plurality of bottom plates 11 on a field oxide 5, a plurality of top plates 20 and a common dielectric layer 30 between the bottom plates 11 and the top plates 20. The bottom 11 and top 20 plates of conductive material are laid out in rows or strips The non-conductive layer 50, shown in the figures as a single layer, but as in the previous embodiment may be the amalgamation of several non-conductive layers, fills the avenues between the conductive strips of the top plates 20 and covers the top plates 20 in order to isolate the bottom plates 11 and the top plates 20 from each other and from subsequent conductive layers.

Each bottom plate 11 is coupled to one or more metal contacts 40 which penetrates the dielectric 30 and non-conductive layers 50 via apertures in the avenues created between the plurality of top plates 20. The metal contacts 45 are coupled to the top plates 20. The metal contacts 40 and 45 may also be connected to the remainder of the circuit by a variety of techniques know to those skilled in the art of semiconductor fabrication.

Figure 4A:
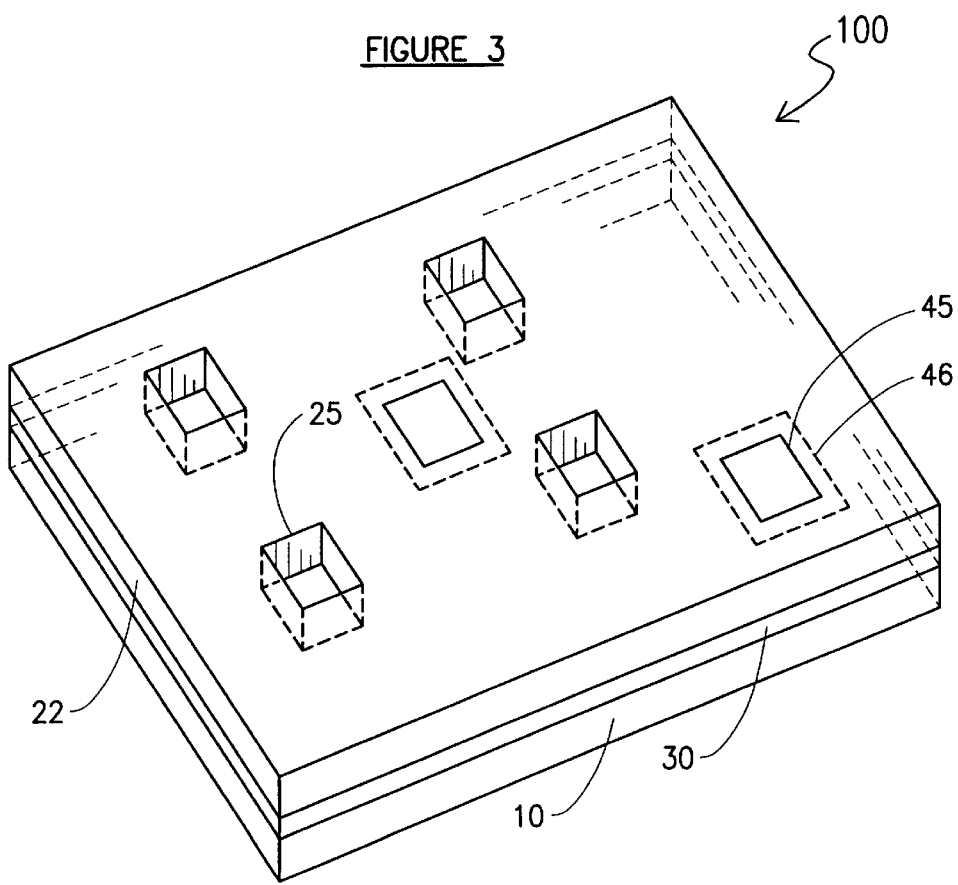
FIG. 4A is a angled view of a third embodiment of the present invention.

Referring to FIG. 4A, where like numerals represent like elements, another embodiment of the improved layout technique for a high Q capacitor 100 comprises a capacitor with a single bottom plate 10, a single top plate 22 with a plurality of apertures 25 and a plurality of surface metal contacts 45 and a common dielectric layer 30 between the bottom plate 10 and the top plate 22. Present, but not shown, are the protective non-conductive layers 50 described in the previous embodiments.

The apertures 25 in the top plate 22 permit metal contacts 40 (not shown) to contact the bottom plate 10 without contacting or shorting to the top plate 22. With certain fabrication techniques as described below, for example when the top plate 22 is polysilicon and the bottom plate 10 is substrate (i.e. MOS capacitor), the surface metal contacts 45 are positioned on field islands 46, i.e. a thin film of insulating material such as silicon dioxide.

Figure 4B:
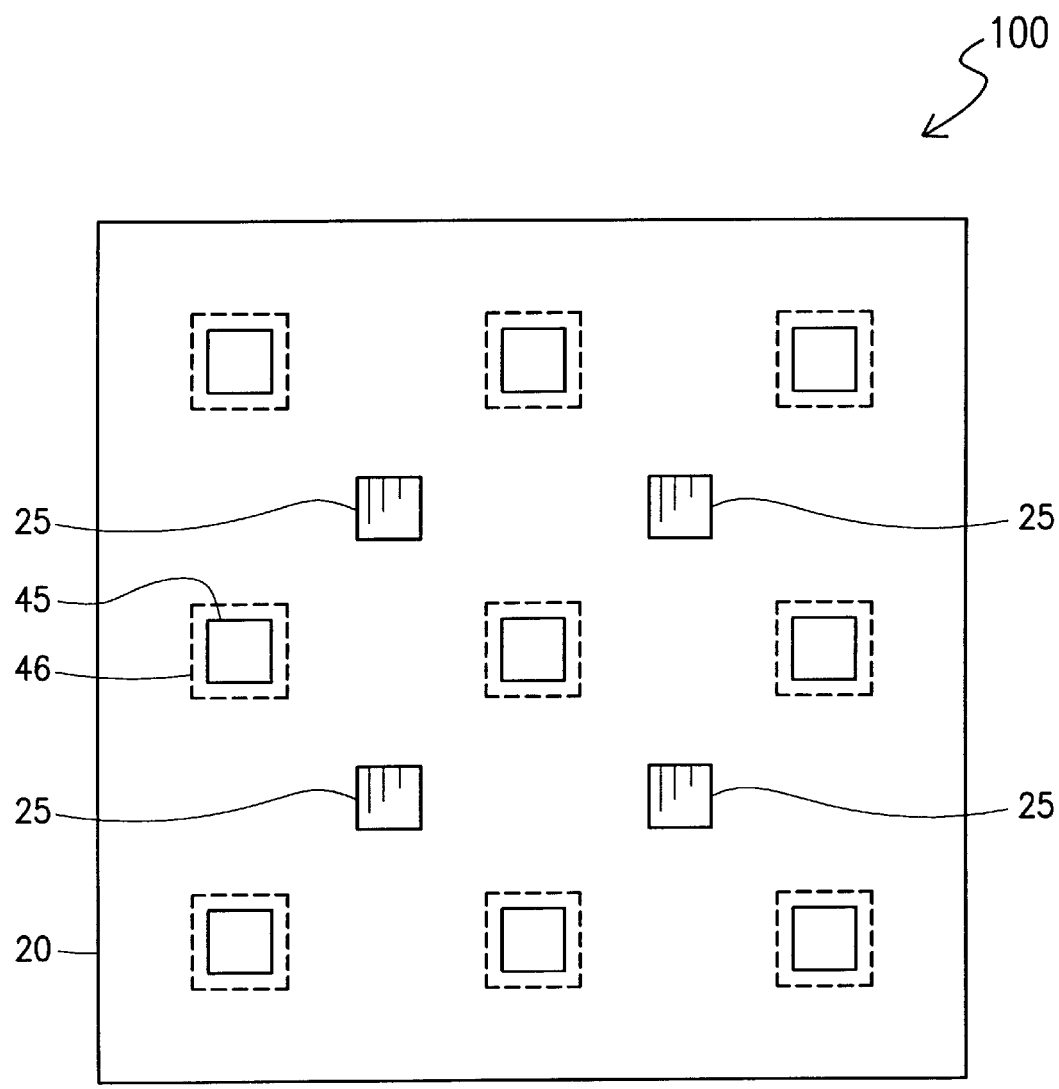
FIG. 4B is a top view of a third embodiment of the present invention.

The apertures 25, as shown in FIGS. 4A and 4B, are rectangular in shape, however those skilled in the art will recognize that other polygon or circular geometries are possible. The metal contacts 40 (not shown) and 45 are then connected to the remainder of the circuit through a variety of techniques known to those skilled in the art of semiconductor fabrication.

In each of the embodiments described above, but using FIG. 2 as a reference for each configuration described below, the composition of the bottom plate 10, top plate 20 and dielectric layer 30 may vary with respect to the application. In one configuration the bottom plate 10 is a polycrystalline silicon layer that is deposited on a oxidized single crystal silicon substrate. The dielectric layer 30, whose characteristics are described below, is situated on the polysilicon layer that forms the bottom plate 10. The top plate 20 is a second polycrystalline silicon layer which is deposited on the dielectric layer 30.

In a second configuration the bottom plate 10 is a single crystal silicon substrate doped to provide a capacitance characteristic. The dielectric layer 30 is again situated on the bottom plate 10. The top plate 20 is comprised of a polycrystalline silicon layer which is deposited on the dielectric layer.

In a third configuration the bottom plate 10 is a polycrystalline silicon layer that is deposited on an oxidized single crystal silicon substrate. The dielectric layer 30 is situated on the bottom plate 10. The top plate 20 is a metal composition, i.e. aluminum, copper or other conductive metal, which is deposited on the dielectric layer 30.

In a fourth configuration the bottom plate 10 is a single crystal silicon substrate doped to provide a capacitance characteristic. The dielectric layer 30 is again situated on the bottom plate 10. The top plate 20 is a metal composition, i.e. aluminum, copper or other conductive metal, which is deposited on the dielectric layer 30.

The polycrystalline silicon layer (aka polysilicon, aka poly) described in the above various configurations is a semiconductor type material which may or may not exhibit amorphous-like characteristics as part of the crystalline structure. The dielectric layer described in the above configurations may be comprised of silicon dioxide, silicon nitride, oxynitride, or any combination thereof. Moreover, additional configurations of semiconductive material, i.e. polysilicon, and conductive materials, i.e. metal, used to form the bottom and top plates and the dielectric layer (e.g. silicon on insulator) which accomplish substantially the same result are anticipated by the present invention.

Photolithographic and etching techniques well known in the art of semiconductor process may be employed to pattern the bottom plates 10 and top plates 20 as illustrated in FIGS. 2–4, comprising layout techniques such as strips, avenues and apertures. These unique layout features of the capacitor 100 limit the distance between the metal contacts 45 associated with the top plate 20 (alternatively top plates 22) and the metal contacts 40 associated with the bottom plate 10 (alternatively bottom plates 11), thereby lowering the intrinsic resistive component and improving the quality factor of the capacitor 100.

Although the invention has been particularly shown and described with reference to a preferred embodiment thereof, it will be understood by those skilled in the art that changes in form and detail may be made therein without departing from the spirit and scope of the invention.

What is claimed is:

1. An improved high quality factor capacitor, comprising:
    a bottom conductive plate wherein the bottom conductive plate is either of a polycristalline silicon layer that is deposited on a oxidized single crystal silicon substrate or a single crystal silicon substrate doped to provide a capacitance characteristic;
    a dielectric layer coupled to the bottom conductive plate;
    a top conductive plate coupled to the dielectric layer wherein the top conductive plate comprises a plurality of apertures;
    a plurality of metal contacts coupled to the bottom conductive plate wherein at least one of the plurality of metal contacts penetrates at least one of the plurality of apertures without contacting the top conductive plate; and
    a second plurality of metal contacts coupled to the top conductive plate;
    wherein the capacitor is implemented on a single, monolithic integrated circuit.

2. The capacitor in accordance with claim 1 wherein the dielectric layer is of a material selected from the group consisting of silicon dioxide, silicon nitride and oxynitride.

3. The capacitor in accordance with claim 1 wherein the top conductive plate is of a material selected from the group consisting of polycrystalline silicon and metal.

4. The capacitor in accordance with claim 1 wherein a series resistance that is intrinsic to a capacitor is reduced.

5. The capacitor in accordance with claim 1 wherein the quality factor of the capacitor is improved.

* * * * *